United States Patent
Hooper et al.

(10) Patent No.: US 7,648,577 B2
(45) Date of Patent: Jan. 19, 2010

(54) MBE GROWTH OF P-TYPE NITRIDE SEMICONDUCTOR MATERIALS

(75) Inventors: Stewart E. Hooper, Oxfordshire (GB); Katherine L. Johnson, Oxford (GB); Valerie Bousquet, Oxford (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 514 days.

(21) Appl. No.: 10/536,706

(22) PCT Filed: Nov. 27, 2003

(86) PCT No.: PCT/JP03/15200

§ 371 (c)(1), (2), (4) Date: Jan. 3, 2006

(87) PCT Pub. No.: WO2004/051719

PCT Pub. Date: Jun. 17, 2004

(65) Prior Publication Data

US 2006/0121637 A1 Jun. 8, 2006

(30) Foreign Application Priority Data

Nov. 30, 2002 (GB) .................... 0228019.6

(51) Int. Cl.
*C30B 25/14* (2006.01)

(52) U.S. Cl. ............... 117/108; 117/89; 117/92; 117/103; 117/105; 117/952; 438/507; 438/508; 438/509

(58) Field of Classification Search ............. 438/508, 438/507, 509, 483, 93, 46, 933, 22, 479; 117/84, 90, 94, 97, 102, 9, 41, 43, 77, 98, 117/952, 2, 3, 89, 93, 105, 7, 92, 103, 108
See application file for complete search history.

(56) References Cited

U.S. PATENT DOCUMENTS 4,916,089 A * 4/1990 Van Suchtelen et al. ....... 117/93

(Continued)

FOREIGN PATENT DOCUMENTS

EP 1 164 210 A 12/2001

(Continued)

OTHER PUBLICATIONS

Mayer M. et al.; "Reactive MBE of group III nitrides: high-quality homoepitaxial GaN and ultra-violet light-emitting diodes" Journal of Crystal Growth, North-Holland Publishing Co. Amsterdam, NL, vol. 201-202, May 1999, pp. 318-322, XP004175132.

(Continued)

*Primary Examiner*—Eric Hug
*Assistant Examiner*—Seyed Masoud Malekzadeh
(74) *Attorney, Agent, or Firm*—Renner, Otto, Boisselle & Sklar, LLP

(57) ABSTRACT

A method of growing a p-type nitride semiconductor material by molecular beam epitaxy (MBE) uses bis(cyclopentadienyl)magnesium (Cp2Mg) as the source of magnesium dopant atoms. Ammonia gas is used as the nitrogen precursor for the MBE growth process. To grow p-type GaN, for example, by the method of the invention, gallium, ammonia and Cp2Mg are supplied to an MBE growth chamber; to grow p-type AlGaN, aluminum is additionally supplied to the growth chamber. The growth process of the invention produces a p-type carrier concentration, as measured by room temperature Hall effect measurements, of up to 2 $10^{17}$ cm−3, without the need for any post-growth step of activating the dopant atoms.

15 Claims, 3 Drawing Sheets

U.S. PATENT DOCUMENTS

| | | | |
|---|---|---|---|
| 5,019,423 A * | 5/1991 | Hiai et al. | 427/248.1 |
| 5,585,648 A * | 12/1996 | Tischler | 257/77 |
| 5,602,418 A * | 2/1997 | Imai et al. | 257/627 |
| 5,661,074 A * | 8/1997 | Tischler | 438/32 |
| 5,725,674 A * | 3/1998 | Moustakas et al. | 118/723 VE |
| 5,874,747 A * | 2/1999 | Redwing et al. | 257/77 |
| 5,891,790 A * | 4/1999 | Keller et al. | 438/508 |
| 5,902,393 A * | 5/1999 | Nido et al. | 117/2 |
| 6,146,458 A * | 11/2000 | Hooper et al. | 117/106 |
| 6,191,437 B1 | 2/2001 | Sonobe et al. | |
| 6,284,042 B1 | 9/2001 | Sasaoka | |
| 6,440,214 B1 | 8/2002 | Hooper et al. | |
| 6,452,954 B2 * | 9/2002 | Fukunaga | 372/46.01 |
| 6,531,716 B2 * | 3/2003 | Udagawa | 257/94 |
| 6,750,075 B2 * | 6/2004 | Razeghi | 438/48 |
| 2001/0036678 A1 * | 11/2001 | Udagawa | 438/22 |
| 2002/0045340 A1 * | 4/2002 | Iyechika et al. | 438/648 |
| 2002/0117103 A1 * | 8/2002 | Hooper et al. | 117/84 |
| 2004/0214412 A1 * | 10/2004 | Barnes et al. | 438/483 |

FOREIGN PATENT DOCUMENTS

| | | |
|---|---|---|
| JP | 10-265298 | 10/1998 |
| JP | 2001-044123 | 2/2001 |

OTHER PUBLICATIONS

Mayer M. et al.; "Device performance of ultra-violet emitting diodes grown by MBE" Journal of Crystal Growth, North-Holland Publishing Co. Amsterdam, NL, vol. 189-190, Jun. 15, 1998, pp. 782-785, XP004148622.

Abernathy C.R. et al.; "Growth of group III nitrides by metalorganic molecular beam expitaxy" Journal of Crystal Growth, North-Holland Publishing Co. Amsterdam, NL, vol. 178, No. 1-2, Jun. 1, 1997, pp. 74-86, XP004084976.

Yang Z. et al.; "High-quality GaN and AlN grown by gas-source molecular beam epitaxy using ammonia as the nitrogen source" Journal of Crystal Growth, North-Holland Publishing Co. Amsterdam, NL, vol. 14, No. 3, May 1, 1996, pp. 2354-2356 XP000621863.

International Search Report for corresponding Application No. PCT/JP2003/015200, mailed Sep. 3, 2004.

Japanese Office Action for corresponding Application No. 2004-556848 dated Apr. 13, 2009.

C. R. Abernathy et al.; Mg doping of InP and InGaAs grown by metalorganic molecular beam epitaxy using bis-cyclopentadienyl magnesium; Applied Physics Letters; Jan. 18, 1993, vol. 62, pp. 258-260.

Japanese Office Action for corresponding Application No. 2004-556848 dated Jul. 7, 2009.

* cited by examiner

MBE GROWTH OF P-TYPE NITRIDE SEMICONDUCTOR MATERIALS

TECHNICAL FIELD

This invention relates to a molecular beam epitaxy (MBE) method for the epitaxial growth of a Group III nitride semiconductor material such as, for example, a member of the (Ga,Al)N material family. It particularly relates to the growth of a p-type doped nitride semiconductor material.

BACKGROUND ART

As used herein, the term "(Ga,Al)N" denotes all members of the $Ga_xAl_{1-x}N$ ($0 \leqq x \leqq 1$) material family. The term "AlGaN" denotes a member of the $Ga_xAl_{1-x}N$ material family for which x is non-zero but is less than one.

Many electronic devices and optoelectronic devices are based on the (Ga,Al)N material family. These devices require at least one interface between an n-type doped material and a p-type doped material, in order to form a p:n junction and/or allow injection of electrical carriers into the device. GaN and AlGaN are both naturally an n-type doped semiconductor material, and p-type doped GaN or AlGaN is obtained by introducing a suitable dopant species during the GaN or AlGaN growth process. Magnesium is often used as a p-type dopant for GaN and AlGaN. Many devices require a free carrier concentration in the p-type doped GaN or AlGaN of at least $10^{18}$ cm$^{-3}$, however, and there have been difficulties in obtaining such carrier concentrations in magnesium-doped GaN or AlGaN. It is relatively straightforward to incorporate magnesium atoms into GaN or AlGaN, but only a few percent of magnesium dopant atoms are electrically activated and the un-activated dopant atoms do not give rise to free charge carriers.

The epitaxial growth of Group III nitride semiconductor materials on a substrate can be effected by molecular beam epitaxy (MBE) or by chemical vapour deposition (CVD) which is sometimes known as Vapour Phase Epitaxy (VPE).

CVD (or VPE) takes place in an apparatus which is commonly at atmospheric pressure but sometimes at a slightly reduced pressure of typically about 10 kPa. Ammonia and the species providing one or more Group III elements to be used in epitaxial growth are supplied, using a carrier gas, substantially parallel to the surface of a substrate upon which epitaxial growth is to take place, thus forming a boundary layer adjacent to and flowing across the substrate surface. It is in this gaseous boundary layer that decomposition to form nitrogen and the other elements to be epitaxially deposited takes place so that the epitaxial growth is driven by gas phase equilibria.

In contrast to CVD, MBE is carried out in a high vacuum environment. In the case of MBE as applied to the GaN system, an ultra-high vacuum (UHV) environment, typically around $1 \times 10^{-3}$ Pa, is used Ammonia or another nitrogen precursor is supplied to the MBE chamber by means of a supply conduit and a species providing gallium and, possibly, indium and/or aluminium and/or a dopant species are supplied from appropriate sources within heated effusion cells fitted with controllable shutters to control the amounts of the species supplied into the MBE chamber during the epitaxial growth period. The shutter-control outlets from the effusion cells and the nitrogen supply conduit face the surface of the substrate upon which epitaxial growth is to take place. The ammonia and the species supplied from the effusion cells travel across the MBE chamber and reach the substrate where epitaxial growth takes place in a manner which is driven by the deposition kinetics.

At present, the majority of growth of high quality GaN layers is carried out using the metal-organic chemical vapour deposition (MOCVD) process. The MOCVD process allows good control of the growth of the nucleation layer and of the annealing of the nucleation layer. Furthermore, the MOCVD process allows growth to occur at a v/III ratio well in excess of 1000:1. The V/III ratio is the molar ratio of the group V element to the Group III element during the growth process. A high V/III ratio is preferable, since this allows a higher substrate temperature to be used which in turn leads to a higher quality GaN layer.

In the growth of p-type GaN or AlGaN by MOCVD the p-type dopant source is typically bis(cyclopentadienyl)magnesium or bis(methylcyclopentadienyl)magnesium; these are also known as $Cp_2Mg$ and $MCp_2Mg$ respectively.

There have been several reports of the growth of p-type doped GaN by MOCVD such as, for example, U.S. Pat. No. 5,306,662. It has generally been found that the magnesium dopant atoms in magnesium-doped GaN grown by MOCVD are inactive, so that post-growth processing is required to activate the magnesium atoms in order to generate free charge carriers. This is because magnesium atoms are passivated if the growth process is carried out in the presence of hydrogen. Large quantities of hydrogen are present in the growth of GaN by MOCVD (arising from the hydrogen carrier gas, and from the decomposition of ammonia gas if this is used as the nitrogen source), and these tend to passivate magnesium-doped GaN. It has generally been found necessary to activate, the magnesium-doped GaN grown by MOCVD to obtain a reasonable density of free charge carriers, for example by annealing the material or by irradiating the material with a low energy electron beam.

Further disclosures of use of $Cp_2MG$ as a p-type dopant in MOCVD growth of GaN or AlGaN are given in U.S. Pat. Nos. 5,831,277 and 5,930,656, and a disclosure of use of $Cp_2MG$ as a p-type dopant in plasma-assisted chemical beam epitaxial growth is given in U.S. Pat. No. 5,637,146. EP-A-0 307 995 discloses use of $Cp_2MG$ as a p-type dopant in MOCVD growth of GaAs.

U.S. Pat. No. 6,043,140 reports a method of an MOCVD growth process that obtains p-type conductivity in GaN without the need for an annealing step, but this method requires very specific amine gases for the nitrogen source.

At present, growing high quality GaN layers by MBE is more difficult than growing such layers by MOCVD. The principal difficulty is in supplying sufficient nitrogen during the growth process. The two commonly used sources of nitrogen in the MBE growth of nitride layers are plasma excited molecular nitrogen or ammonia.

There have been a number of reports of MBE growth of magnesium-doped GaN that do not require a post-growth annealing or irradiation step and these include U.S. Pat. Nos. 5,657,335 and 6,123,768. The MBE process does not use hydrogen carrier gas, so that the hydrogen level in a MBE growth system is generally lower than the hydrogen level in a MOCVD growth system; as a result passivation of the obtained magnesium-doped GaN is less of a problem in MBE growth than in MOCVD growth. In particular, many reports of MBE growth of GaN use an activated nitrogen plasma source as the nitrogen precursor rather than ammonia, and this eliminates the presence of hydrogen arising from the decomposition of ammonia M. Mayer et al. have reported, in "J. Cryst. Growth", Vol 201/202 p318-322 (1999) and in "Proc. $2^{nd}$ International Conf. on Nitride Semiconductors" (1997), growth of p-type GaN by MBE. Ammonia is used at the nitrogen precursor, and $MCp_2Mg$ is used as the source of magnesium dopant atoms. These reports describe neither the growth conditions used nor the p-doping levels achieved. EP-A-1 164 210 discloses MBE growth of undoped GaN at growth temperatures of 850° C. or above.

DISCLOSURE OF THE INVENTION

The present invention provides a method of growing a p-type nitride semiconductor material by molecular beam epitaxy, the method comprising supplying bis(cyclopentadienyl)magnesium ($Cp_2Mg$) during the growth process. The nitride semiconductor material may be p-type (Ga,Al)N, and the method may comprise supplying ammonia gas during the growth process as the nitrogen precursor for the MBE process. It has been found that the use of $Cp_2Mg$ as the source of magnesium dopant atoms enables p-type doped nitride semiconductor materials, such as p-type (Ga,Al)N, to be obtained without the need for any post-processing step.

It has previously been expected that use of $Cp_2Mg$ as a dopant in MBE growth of semiconductor layers would give rise to undesirable carbon contamination in the resultant semiconductor layers. $Cp_2Mg$ contains hydrocarbon materials, which are known to be sources of severe contamination if used in MBE growth. However, it has been found that $Cp_2Mg$ may be used as a dopant in MBE growth of nitride layers without causing carbon contamination of the resultant layers provided that the growth is carried out at a sufficiently high temperature.

The method may comprise supplying ammonia gas, gallium and $Cp_2Mg$ to a growth chamber, thereby to grow a layer of p-type GaN. It may alternatively comprise supplying ammonia gas, aluminium, gallium and $Cp_2Mg$ to a growth chamber, thereby to grow a layer of p-type AlGaN. Gallium is supplied as a beam of elemental gallium and, in the case of growth of AlGaN, aluminium is also supplied as a beam of elemental aluminium.

The supply rate of $Cp_2Mg$ may be kept constant during the growth of the nitride semiconductor material, to produce a p-type material having a uniform doping concentration throughout its depth. Alternatively, the method may comp se changing the supply rate of $Cp_2Mg$ during the growth of the nitride semiconductor material so as to grow a p-type material having a carrier concentration that varies over the depth of the material. For example, the supply rate of $Cp_2Mg$ may be controlled so as to produce, for example, a graded carrier concentration or a step-like carrier concentration in the semiconductor material.

The growth process may be carried out at a growth temperature of at least 700° C. Performing the growth at a growth temperature of at least 700° C. provides good crystal quality in the resultant semiconductor material.

The growth process may be carried out at a growth temperature of at least 800° C. Performing the growth at a growth temperature of at least 800° C. reduces carbon contamination in the resultant semiconductor material.

The growth process may be carried out at a growth temperature of at least 850° C., or at a growth temperature of at least 920° C. Performing the growth at a growth temperature of at least 920° C. ensures good doping characteristics of the resultant semiconductor material.

The growth process may be carried out at a growth temperature of at least 950° C. No significant carbon contamination was found in semiconductor material grown by the method of the invention at a growth temperature of 950° C. or higher.

The growth process may be carried out at a growth temperature of 960° C. or below.

The temperature range of 920 to 960° C. has been found to produce particularly good p-type doping, although the invention can provide p-type doping for any growth temperature above 700° C. provided that appropriate growth conditions are used.

The method may comprise supplying $Cp_2Mg$ at a beam equivalent pressure of at least $1 \times 10^{-9}$ mbar, or at a beam equivalent pressure of at least $3 \times 10^{-9}$ mbar. It may comprise supplying $Cp_2Mg$ at a beam equivalent pressure of $1 \times 10^{-7}$ mbar or below, or at a beam equivalent pressure of $1.5 \times 10^{-8}$ mbar or below. These supply rates have been found to produce material having a good p-type free carrier concentration without the need for any post-growth processing step.

The method may comprise supplying elemental gallium at a beam equivalent pressure of at least $1 \times 10^{-8}$ mbar, and it may comprise supplying elemental gallium at a beam equivalent pressure of $1 \times 10^{-5}$ mbar or below.

Alternatively, the method may comprise supplying elemental gallium and elemental aluminium at an overall beam equivalent pressure of at least $1 \times 10^{-8}$ mbar, and it may comprise supplying elemental gallium and elemental aluminium at an overall beam equivalent pressure of $1 \times 10^{-5}$ mbar or below.

A second aspect of the invention provides a p-type nitride semiconductor material grown by a method of the first aspect.

A third aspect of the invention provides a semiconductor device comprising a layer of a p-type nitride semiconductor material grown by a method of the first aspect.

The layer of nitride semiconductor material may be a layer of p-type (Ga,Al)N.

BRIEF DESCRIPTION OF THE DRAWINGS

Preferred embodiments of the present invention will now be described by way of illustrative example with reference to the accompanying Figures in which.

Figure 1:
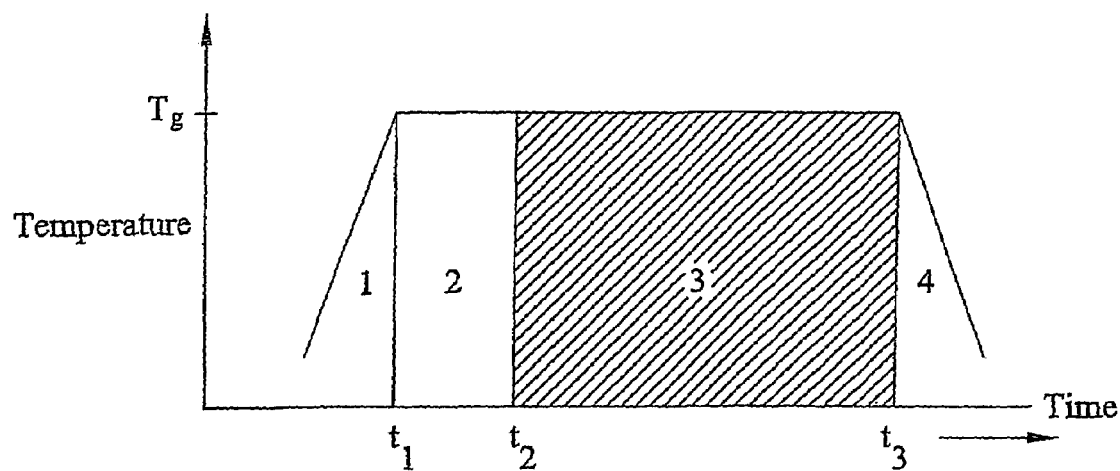
FIG. 1 is a schematic illustration of the growth of p-type (Ga,Al)N by a method according to the present invention.

One example of a growth method according to the present invention will now be described. This example illustrates the growth of a magnesium-doped (Ga,Al)N layer, but the invention is not limited to this particular material system and may be used with other nitride semiconductors.

BEST MODE FOR CARRYING OUT THE INVENTION

A suitable substrate is prepared in any conventional manner, and is introduced into the growth chamber of an MBE apparatus. The substrate may be, for example, a GaN substrate. A GaN substrate for use in the epitaxial growth of (Ga,Al)N can have two possible forms—it may be a "free-standing" substrate, or a "template" substrate. A free-standing GaN substrate consists solely of GaN, and is formed by, for example, a GaN crystal. A template GaN substrate consists of a thick epitaxial layer of GaN grown on a base substrate of, for example, sapphire or silicon carbide. The thick epitaxial layer is grown on the base substrate by any suitable technique such as metal-organic vapour phase epitaxy (MOVPE), hydride vapour phase epitaxy (HVPE) or MBE. The epitaxial layer of a GaN template substrate is relatively thick, for example having a thickness in a range 5µm-100µm. The base substrate may alternatively be formed of silicon, zinc oxide or magnesium oxide.

Alternatively, the substrate may be an AlGaN substrate or an InGaN substrate (where "InGaN" denotes a member of the $In_yGa_{1-y}N$ material family having a value of y that is non-zero but is less than 1), and these may again be a free-standing substrate or a template substrate. As a further alternative, the substrate may be a multilayer structure that has a GaN layer, AlGaN layer or an InGaN layer as its uppermost layer.

Once the substrate has been prepared and introduced into the growth chamber, the substrate is heated to a desired temperature $T_g$ for MBE growth. There are a number of considerations that affect the choice of growth temperature.

Firstly, the substrate temperature (which may be considered as defining a temperature for the growth process) is preferably at least 700° C. during the growth process and more preferably is at least 850° C., to ensure that a good quality (Ga,Al)N layer is grown. In practice, the constraints of available MBE apparatus used have been found to limit the substrate temperature obtainable to a maximum temperature of around 1,000° C. or 1,050° C. A higher substrate temperature may, in principle, be used in a method of the present invention, but a maximum substrate temperature of 1,050° C. is acceptable since it corresponds to a typical growth temperature obtainable by an MOCVD process for growing a nitride semiconductor material.

Moreover, the growth temperature must be sufficiently high to keep carbon contamination of the resultant material, resulting from the use of $Cp_2Mg$ as dopant, down to an acceptable level; the growth temperature is preferably sufficiently high so that carbon contamination of the resultant material is effectively suppressed. It has been found that contamination of the resultant material is significantly reduced (compared to contamination in material grown at low growth temperatures) if the growth temperature is 800° C. or above. Carbon contamination of the resultant material is virtually completely eliminated at a growth temperature of approximately 950° C. or above.

Furthermore, as will be discussed below, considerations relating to the doping process mean that the substrate temperature during the growth process is particularly preferably at least 920° C., and is not more than 960° C.

In view of these various requirements concerning the growth temperature, a growth temperature of around 950° C. has been found to be particularly suitable.

Thus, in the method of the invention, the substrate is initially heated up to a pre-determined temperature $T_g$ that is at least 700° C., more preferably is between 920° C. and 960° C., and particularly preferably is approximately 950° C. This is shown as step 1 in FIG. 1.

The rate at which the temperature of the substrate is increased should not be so great that an uneven temperature distribution might occur in the substrate, since this would set up thermal stresses in the substrate. A temperature ramp rate in the range of 10-120° C. per minute has been found to be acceptable.

GaN tends to decompose when it is heated to a temperature of around 800° C. or above. This decomposition can be prevented by supplying an overpressure of nitrogen gas or ammonia gas to the surface of the GaN. It is therefore preferable to supply ammonia gas to the growth chamber while the substrate temperature is being increased, in order to prevent thermal decomposition of the substrate. In principle, ammonia gas does not need to be supplied at temperatures substantially below 800° C., but it is generally more convenient to supply the ammonia gas for the entire duration of the heating step.

Once the substrate has reached the desired temperature $T_g$, it is maintained at this temperature to bake the substrate and remove contaminants from the substrate. This is step 2 in FIG. 1, which starts at time $t_1$ and extends to time $t_2$. It has been found that a baking step having a duration of between 5 minutes and 30 minutes is suitable.

The supply of ammonia to the growth chamber is preferably maintained during the baking step, to prevent the thermal decomposition of the substrate. Supplying ammonia gas also promotes the removal of contaminants from the surface of the substrate during the baking step, and achieves nitridation of the surface of the substrate.

Once the thermal baking step has been completed, a magnesium-doped (Ga,Al)N layer is grown by molecular beam epitaxy on the substrate. As noted above, ammonia gas is already being supplied to the substrate, and this will act as a source of nitrogen for the MBE growth process. Thus, in order to start the MBE growth of magnesium-doped GaN it is necessary to provide a source of gallium and a source of magnesium Once gallium and magnesium are supplied to the growth chamber, MBE growth of a magnesium-doped GaN layer over the substrate will occur. In order to start the MBE growth of magnesium-doped AlGaN it is also necessary to provide a source of aluminium.

In this embodiment, gallium for the MBE growth of a GaN layer is supplied by a beam of elemental gallium having a beam equivalent pressure in the range $1 \times 10^{-8}$ to $1 \times 10^{-5}$ mbar. A suitable beam equivalent pressure for the supply of ammonia gas during the growth process is in the range $1 \times 10^{-5}$ to $1 \times 10^{-2}$ mbar. The same beam equivalent pressure of ammonia can be used in the baking step as in the growth step, although it is not necessary to use the same beam equivalent pressure in the baking and growth steps.

In order to grow an AlGaN layer, elemental aluminium is also supplied to the growth chamber. In this case the overall beam equivalent pressure of elemental gallium and elemental aluminium is preferably within the range $1 \times 10^{-8}$ to $1 \times 10^{-5}$ mbar.

According to the invention, magnesium for the growth process is supplied by a flux of bis(cyclopentadienyl)magnesium (known as $Cp_2Mg$). As will be explained below, the b.e.p. of $Cp_2Mg$ is preferably greater than $3 \times 10^{-9}$ mbar and is preferably less than $1.1 \times 10^{-8}$ mbar, although it may take any value in the range from $1 \times 10^{-9}$ to $1 \times 10^{-7}$ mbar.

The MBE growth step is step 3 in FIG. 1. The supply to the growth chamber of gallium and $Cp_2Mg$, and also the supply of aluminium in the case of growth of an AlGaN layer, is started at time $t_2$.

The supply rate of $Cp_2Mg$ may be kept substantially constant during step 3. This will produce p-type (Ga,Al)N having a substantially uniform p-type free carrier concentration throughout its depth. Alternatively, the method may comprise changing the supply rate of $Cp_2Mg$ during step 3, so as to grow a p-type (Ga,Al)N layer having a free carrier concentration that varies intentionally over the depth of the layer. For example, if it is desired to grow a p-type (Ga,Al)N layer having a graded carrier concentration, the supply rate of $Cp_2Mg$ may be gradually increased (or decreased) over the duration of step 3. Alternatively, if it is desired to grow a p-type (Ga,Al)N layer having a step-like carrier concentration, the supply rate of $Cp_2Mg$ may be increased (or decreased) in a step-like manner during step 3.

The $Cp_2Mg$ is supplied to the MBE growth chamber as a gas or a vapour. It is therefore possible for the dopant flux to be controlled—for example switched on or off, or adjusted from one flow rate to another—much more easily than when elemental magnesium is used as the p-type dopant source. (When elemental magnesium is used as the p-type dopant source there is a time lag induced by the need to change the temperature of the magnesium cell; furthermore, magnesium atoms may leak around the shutter of the cell when it is closed and so reach the growth surface.) It is therefore possible to control the doping profile of a GaN or AlGaN layer much more accurately in the present invention than in prior art growth methods that use elemental magnesium as the dopant.

Once the p-type, magnesium-doped GaN or AlGaN layer has been grown to a desired thickness, the growth of the layer is halted by stopping the supply of elemental gallium, $Cp_2Mg$ and, in the case of the growth of an AlGaN layer, elemental aluminium to the growth chamber. This occurs at time $t_3$ in FIG. 1.

The substrate is then cooled, and this is shown as step 4 in FIG. 1. The supply of ammonia gas to the substrate is preferably continued while the substrate temperature is reduced in step 4, at least until the temperature of the substrate has fallen to below 800° C., to prevent thermal decomposition of the GaN.

The temperature ramp rate during the step of cooling the substrate must again be chosen to prevent setting up any undue thermal stresses within the substrate, or between the substrate and the magnesium-doped (Ga,Al)N layer. A temperature ramp rate in the rate of 10-120° C. per minute has again been found to be suitable.

The V/III molar ratio for the MBE growth of the magnesium-doped (Ga,Al)N layer is preferably greater than 10:1, and is preferably less than 5,000:1. Although a V/III molar ratio greater than 5,000:1 could in principle be used, it has been found that the growth rate is slow if the growth is carried out at a V/III molar ratio significantly above 5,000:1. This high V/III molar ratio allows the magnesium-doped (Ga,Al)N layer to be grown at a temperature of 700° C. or greater, which is a significantly higher temperature than used in prior art MBE growth of this material. Because the present invention enables a higher growth temperature to be used, the quality of the resultant (Ga,Al)N layer is improved.

Figure 2:
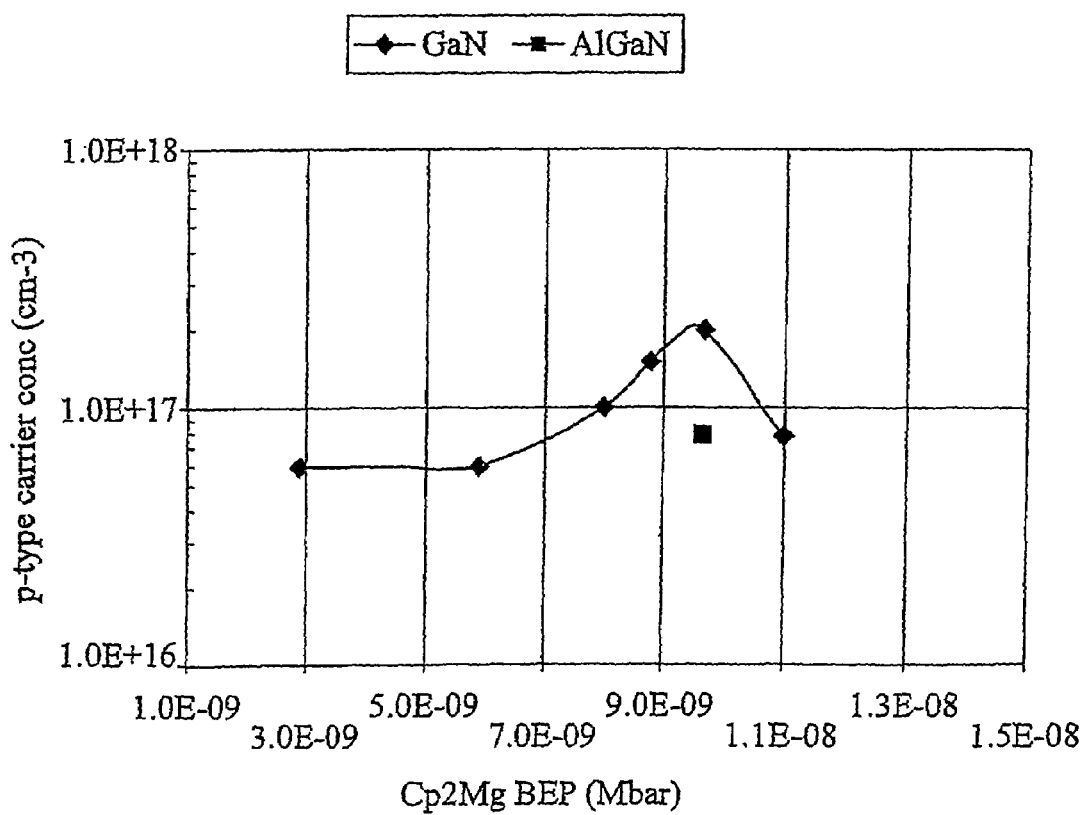
FIG. 2 shows the carrier concentration of p-type GaN and AlGaN as a function of the beam equivalent pressure of $Cp_2Mg$.

FIG. 2 illustrates the carrier concentration of magnesium-doped GaN and AlGaN obtained by a method of the present invention with a growth temperature of 960° C. These carrier concentrations were obtained without an annealing step or other post-growth activation step. The carrier concentrations shown in FIG. 2 were obtained using room temperature Hall Effect measurements.

It will be seen from FIG. 2 that p-type doping is achieved when the b.e.p. of $Cp_2Mg$ is in the range from $3\times10^{-9}$ mbar to $1.1\times10^{-8}$ mbar. If the b.e.p. of $Cp_2Mg$ was below $3\times10^{-9}$ mbar, it was found that n-type doping was obtained As the b.e.p. of $Cp_2Mg$ was increased above $3\times10^{-9}$ mbar the resultant p-type carrier concentration increased, until the doping again became n-type for a b.e.p of $Cp_2Mg$ greater than $1.1\times10^{-8}$ mbar (probably as a result of crystal degradation and formation of lattice defects).

In the results of FIG. 2, p-type doping is obtained when the b.e.p. of $Cp_2Mg$ is in the range from $3\times10^{-9}$ mbar to $1.1\times10^{-8}$ mbar. The invention is not restricted to this range for the b.e.p. of $Cp_2Mg$, however. With appropriate choice of growth conditions, p-type doping can be obtained for a b.e.p. of $Cp_2Mg$ down to $1\times10^{-9}$ mbar, or for a b.e.p. of $Cp_2Mg$ of up $1.5\times10^{-8}$ mbar or even up to $1\times10^{-7}$ mbar.

FIG. 2 shows that a p-type free carrier concentration of up to around $2\times10^{-17}$ $cm^3$ can be obtained using the growth process of the present invention. The results shown in FIG. 2 compare favourably with carrier concentrations of magnesium-doped GaN grown in a MOCVD growth process. Moreover, the present invention provides both an increased growth temperature, and an increased free carrier concentration compared with prior MBE growth of magnesium-doped GaN. Furthermore, there is no need to activate the magnesium dopant atoms by an annealing or irradiation step.

Compared to a typical MOCVD growth process, the MBE growth method of the present invention requires at least 100 times less ammonia gas.

The embodiment described above describes the growth of a single layer of magnesium-doped GaN or AlGaN on a substrate. This has been done for illustrative purposes. In general, however, a layer of magnesium-doped GaN or AlGaN will not be grown in isolation but will be incorporated into an (Al,Ga,In)N electronic or opto-electronic device. Such a device would be obtained by growing a series of layers over a suitable substrate, with one (and possibly more) of the layers being a magnesium-doped GaN or AlGaN layer. In the growth of a practical opto-electronic or electronic device, therefore, once the baking step (step 2) has been completed, a series of layers of different compositions will be grown over the substrate, by varying the atomic species that are supplied to the growth chamber appropriately. In this case, the step (step 3) of growing the magnesium-doped GaN or AlGaN layer need not directly follow the baking step (step 2), and the cool down step (step 4) need not directly follow the step (step 3) of growing the magnesium-doped GaN or AlGaN layer.

For example, the growth process described above could be used to grow an electronic or opto-electronic device in which the first layer to be grown is a magnesium doped GaN or AlGaN layer and, in this case, one or more other (Al,Ga,In)N layers would be grown between the completion of the step (step 3) of growing the magnesium-doped GaN layer and the cool down step (step 4). Alternatively, a magnesium-doped GaN or AlGaN layer could be the last layer of an electronic or opto electronic device and, in this case, one or more other (Al,Ga,In)N layers would be grown over the substrate after the completion of the baking step (step 2) but before the start of the step (step 3) of growing the magnesium-doped GaN or AlGaN layer. As a further alternative a magnesium-doped GaN or AlGaN layer could be an intermediate layer in an electronic or opto-electronic device and, in this case, one or more (Al,Ga,In)N layers would be grown after the completion of the baking step (step 2) before the start of the step (step 3) of growing the magnesium doped GaN or AlGaN layer, and one or more further (Al,Ga,In)N layers would be grown after the completion of the step (step 3) of growing the magnesium-doped GaN or AlGaN layer before the cool down step (step 4).

Figure 3:
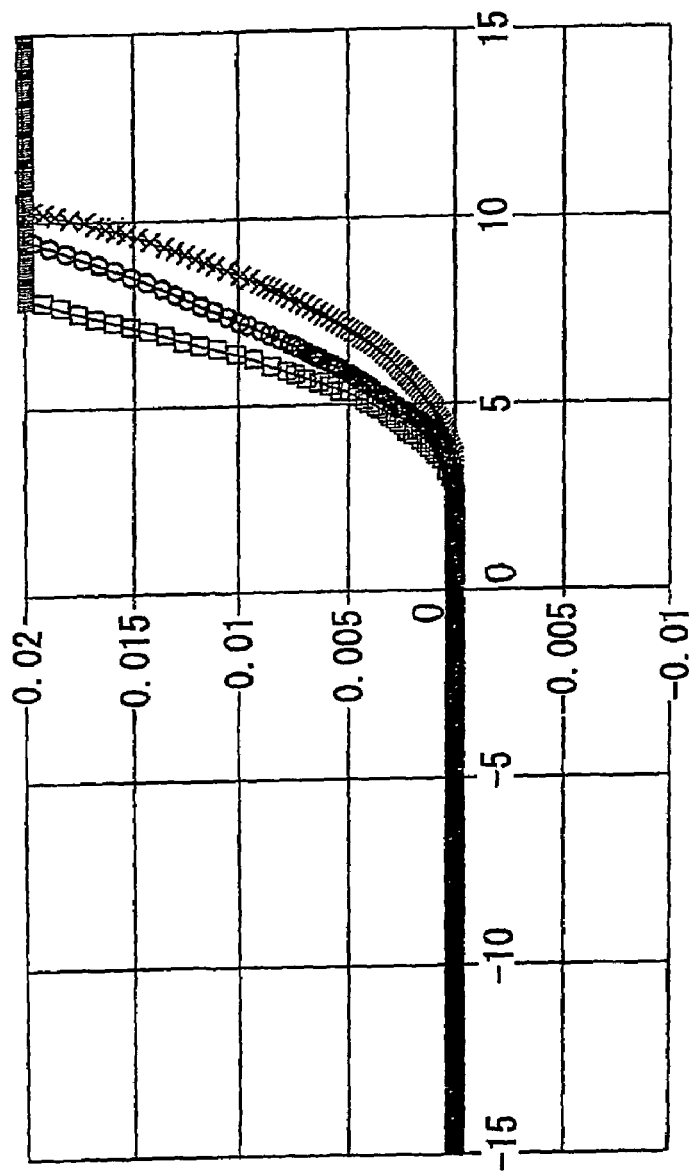
FIG. 3 shows the current-voltage characteristics for InGaN-based light-emitting diodes incorporating a p-type GaN layer grown by a method of the invention.

FIG. 3 shows current-voltage characteristic curves for light-emitting diodes (LEDs) based on the InGaN material system. The LEDs incorporate a p-type GaN layer produced by a method of the invention—that is, by MBE with $Cp_2Mg$ as the nitrogen precursor. Three characteristic curves are shown in FIG. 3, for growth temperatures of the p-type GaN layer of 920° C., 930° C. and 950° C. In each case, the b.e.p. of $Cp_2Mg$ was $1\times10^{-8}$ mbar. It will be seen that each characteristic curve shown in FIG. 3 displays good diode characteristics, and this indicates that p-type GaN layer does have good p-type conductivity.

The range of 920 to 960° C. for the substrate temperature during the growth process has been found to produce particularly good p-type doping. The invention is not limited to this temperature range, however and in principle the invention can provide p-type doping for any growth temperature above 700° C. provided that appropriate growth conditions are used.

Figure 4:
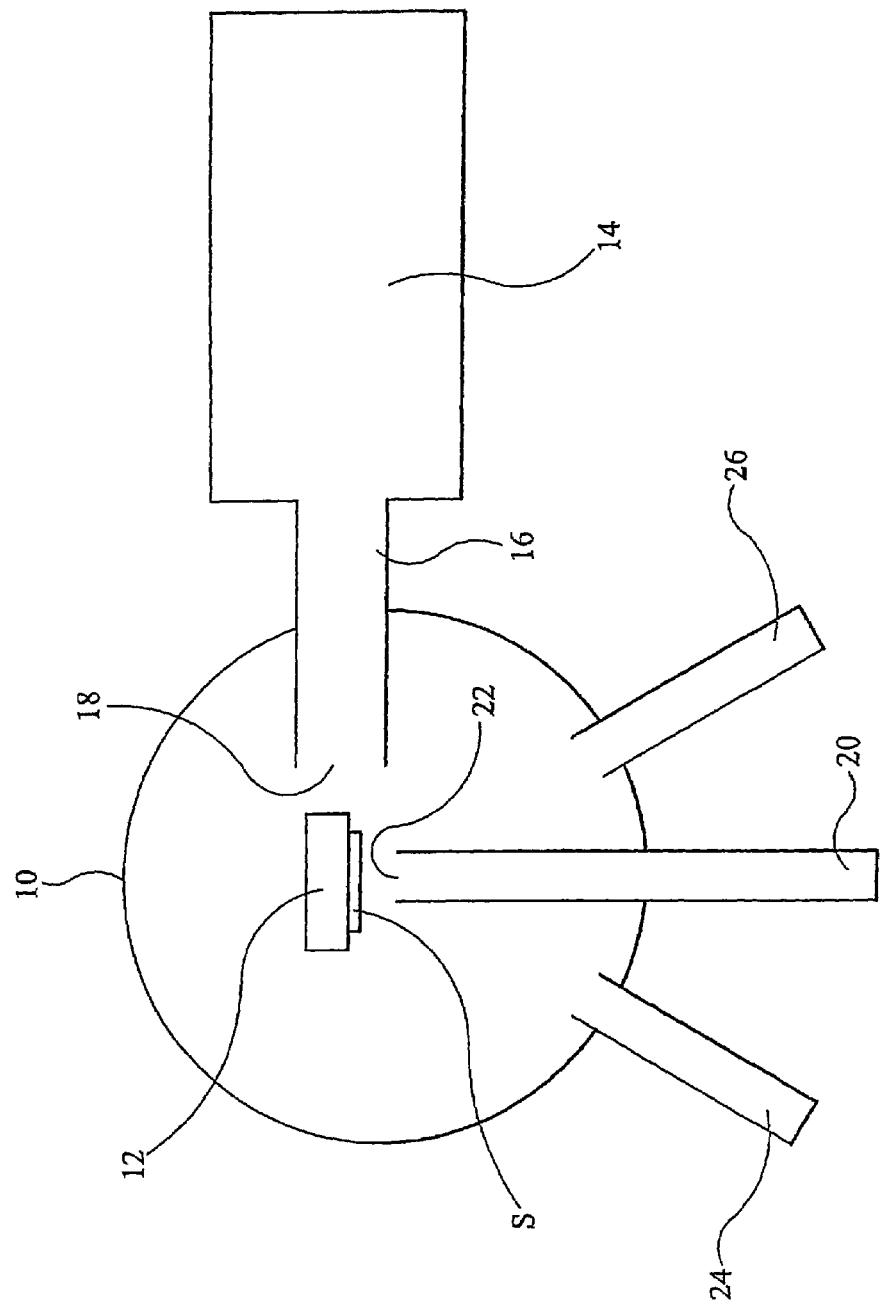
FIG. 4 shows an MBE apparatus suitable for carrying out a growth method of the invention.

FIG. 4 is a schematic view of an apparatus suitable for the growth of a nitride semiconductor material by molecular beam epitaxy according to a method of the present invention. The apparatus comprises a growth chamber 10 in which is disposed a heated support 12 arranged to support and heat a substrate S. The growth chamber 10 is connected with an ultra-high vacuum pump 14 via an exhaust conduit 16 which extends into the growth chamber 10. The inner end of the exhaust conduit 16 defines a vacuum outlet 18 of the growth chamber 10. The vacuum outlet 18 is disposed adjacent to the substrate support 12.

The growth chamber 10 is further provided with a first supply conduit 20 which extends into the growth chamber so that an outlet 22 of the first supply conduit 20 is adjacent to and faces the surface of the substrate S upon which epitaxial growth is to take place. The first supply conduit 20 can be adjustably mounted relative to the chamber so that the relatively small distance between the outlet 22 of the first supply conduit 20 and the epitaxial growth surface of the substrate S can be varied during the epitaxial growth process. The longitudinal axis of the first supply conduit 20 is substantially perpendicular to the plane of epitaxial growth.

The first supply conduit 20 is used to supply ammonia which is the precursor of the nitrogen required in the epitaxial growth process. Because the outlet 22 of the first supply conduit 20 is positioned relatively close to the substrate S, a relatively high ammonia vapour pressure is localised at the surface of the epitaxially growing material while still enabling an ultra-high vacuum environment within the growth chamber 10 to be achieved by the pump 14. The high ammonia vapour pressure enables a high V/III ratio to be realised during the growth process.

The apparatus further comprises independently operable, shutter-controlled effusion cells 24, 26 (two such cells are shown in FIG. 3) which contain sources of elemental gallium and aluminium respectively. Additional effusion cells may be provided if it is necessary to supply additional atomic species during the epitaxial growth process. The effusion cells 24 and 26 are conventionally positioned and define second and further supply conduits respectively.

A MBE apparatus of the type described above is described in European Patent Application No. 98301842.5, the contents of which are hereby incorporated by reference. It should be noted, however, that the present invention is not limited to a MBE apparatus of the type described in European Patent Application No. 98301842.5/0 864 672, but can be carried out in any MBE growth apparatus that can provide the required V/III ratio.

INDUSTRIAL APPLICABILITY

The present invention can provide a method of growing a p-type nitride semiconductor material by molecular beam epitaxy.

The invention claimed is:

1. A method of growing a p-type nitride semiconductor material by molecular beam epitaxy, the method comprising supplying bis(cyclopentadienyl)magnesium ($Cp_2Mg$) during the growth process, and carrying out the growth process at a temperature from 920° C. to 960° C. so that carbon contamination caused by $Cp_2Mg$ is reduced in the semiconductor material.

2. A method as claimed in claim 1, wherein the nitride semiconductor material is p-type (Ga,Al)N.

3. A method as claimed in claim 1, comprising supplying ammonia gas during the growth process.

4. A method as claimed in claim 1, comprising supplying ammonia gas, gallium and $Cp_2Mg$ to a growth chamber, thereby to grow a layer of p-type GaN.

5. A method as claimed in claim 1, comprising supplying ammonia gas, aluminum, gallium and $Cp_2Mg$ to a growth chamber, thereby to grow a layer of p-type AlGaN.

6. A method as claimed in 1, comprising changing the supply rate of $Cp_2Mg$ during the growth of the nitride semiconductor material.

7. A method as claimed in claim 1, wherein the growth process is carried out at a temperature of at least 950° C.

8. A method as claimed in claim 1, comprising supplying $Cp_2Mg$ at a beam equivalent pressure of at least $1\times10^{-9}$ mbar.

9. A method as claimed in claim 1, comprising supplying $Cp_2Mg$ at a beam equivalent pressure of at least $3\times10^{-9}$ mbar.

10. A method as claimed in claim 1, comprising supplying $Cp_2Mg$ at a beam equivalent pressure of $1\times10^{-7}$ mbar or below.

11. A method as claimed in claim 1, comprising supplying $Cp_2Mg$ at a beam equivalent pressure of $1.5\times10^{-8}$ mbar or below.

12. A method as claimed in claim 4, comprising supplying elemental gallium at a beam equivalent pressure of at least $1\times10^{-8}$ mbar.

13. A method as claimed in claim 4, comprising supplying elemental gallium at a beam equivalent pressure of $1\times10^{-5}$ mbar or below.

14. A method as claimed in claim 5, comprising supplying elemental gallium and elemental aluminum at an overall beam equivalent pressure of at least $1\times10^{-8}$ mbar.

15. A method as claimed in claim 5, comprising supplying elemental gallium and elemental aluminum at an overall beam equivalent pressure of $1\times10^{-5}$ mbar or below.

* * * * *